(12) United States Patent
Thompson et al.

(10) Patent No.: US 6,252,454 B1
(45) Date of Patent: Jun. 26, 2001

(54) CALIBRATED QUASI-AUTOZEROED COMPARATOR SYSTEMS AND METHODS

(75) Inventors: Karl Ernesto Thompson, Converse; Carlos Esteban Muñoz, Austin; Douglas S. Piasecki, Dripping Springs; Wai Laing Lee, Austin; Eric Swanson, Buda, all of TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 09/393,055

(22) Filed: Sep. 9, 1999

(51) Int. Cl.[7] ........................................... H03F 1/02
(52) U.S. Cl. ............................. 330/9; 330/2; 327/124
(58) Field of Search ........................... 330/2, 9; 327/124, 327/307, 77, 78, 79

(56) References Cited

U.S. PATENT DOCUMENTS

| | | | |
|---|---|---|---|
| 3,810,031 | * 5/1974 | Poujois | 330/9 |
| 4,048,574 | * 9/1977 | Barbier et al. | 330/9 |
| 4,255,715 | * 3/1981 | Cooperman | 330/9 |
| 4,385,286 | * 5/1983 | Haque | 340/347 AD |
| 4,438,354 | * 3/1984 | Haque et al. | 307/493 |
| 4,736,351 | * 4/1988 | Oliver | 368/118 |
| 4,939,516 | * 7/1990 | Early | 341/143 |
| 5,027,116 | * 6/1991 | Armstrong et al. | 341/120 |
| 5,438,274 | * 8/1995 | Bitar et al. | 324/636 |

* cited by examiner

Primary Examiner—Robert Pascal
Assistant Examiner—Henry Choe
(74) Attorney, Agent, or Firm—David L. Stewart; Steven Lin

(57) ABSTRACT

A multistage comparator is calibrated to remove quasi-autozero voltages derived from the native comparator offset and autozero switch charge injection offsets. A multistage comparator includes a plurality of series connected amplifiers each having a programmable source, and further including a latch. A calibration method for a multistage comparator includes calibrating the first of a series of amplifiers first for both voltage offset and charge injection errors thereby to remove the quasi-autozero voltage and charge injection offsets.

15 Claims, 12 Drawing Sheets

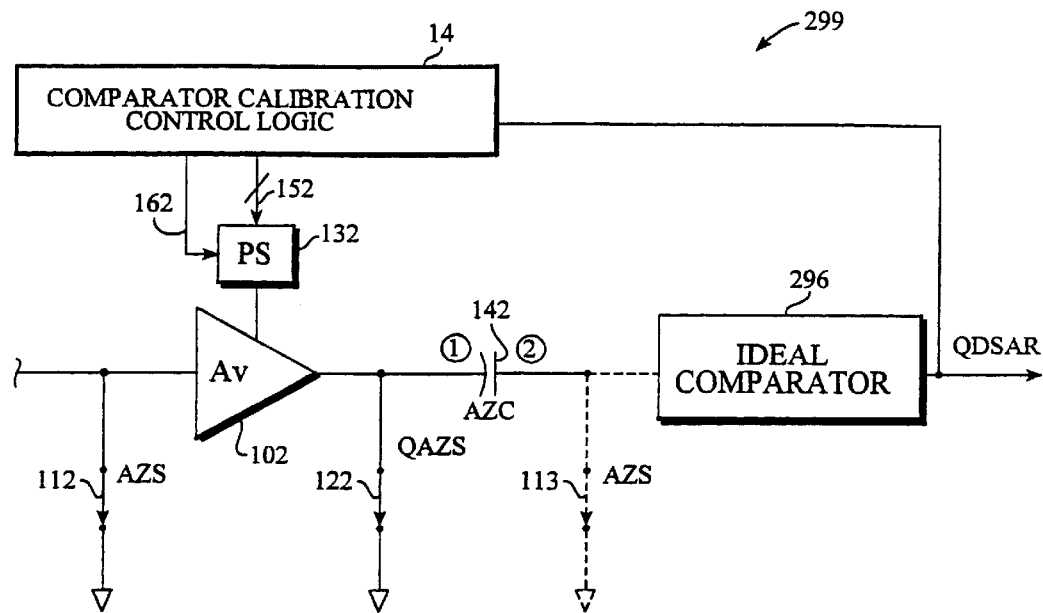
*Fig.* 3A
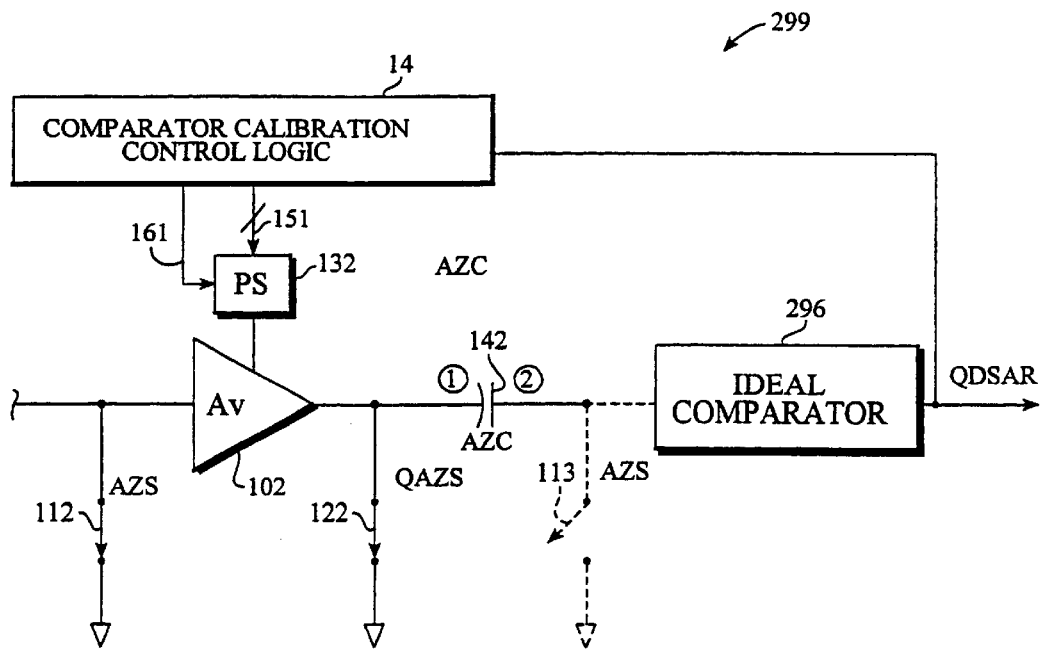
*Fig.* 3B

CALIBRATED QUASI-AUTOZEROED COMPARATOR SYSTEMS AND METHODS

CROSS-REFERENCE TO RELATED APPLICATIONS

This application is related to the following patent applications which are expressly referred to and incorporated herein in their entirety: (1) "System and Method for Adaptive Auto-Calibration of Radix<2 A/D SAR Converters with Internally Generated Stimuli" invented by Carlos Esteban Muñoz, Karl Ernesto Thompson, Douglas S. Piasecki, Wai Laing Lee, and Eric Swanson; U.S. patent application Ser. No. 09/393,079, filed on even date herewith; (2) "Selection and Use of Bit Testing Sequences for Radix<2 A/D SAR Converters" invented by Carlos Esteban Muñoz, Karl Ernesto Thompson, Douglas S. Piasecki, Wai Laing Lee, and Eric Swanson; U.S. patent application Ser. No. 09/393,828, filed on even date herewith; (3) "Successive Approximation Algorithm-Based Architectures and Systems" invented by Carlos Esteban Muñoz, Karl Ernesto Thompson, Douglas S. Piasecki, Wai Laing Lee, and Eric Swanson; U.S. patent application Ser. No.09/393,091, filed on even date herewith; (4) "Successive Approximation Architectures and Systems" invented by Carlos Esteban Muñoz, Karl Ernesto Thompson, Douglas S. Piasecki, Wai Laing Lee, and Eric Swanson; U.S. patent application Ser. No. 09/393,093, filed on even date herewith; (5) "Methods and Systems for Calibration and Conversion in an A/D SAR System including Digital Weight Storage and Accumulation" invented by Carlos Esteban Muñoz, Karl Ernesto Thompson, Douglas S. Piasecki,Wai Laing Lee, and Eric Swanson; U.S. patent application Ser. No. 09/393,826, filed on even date herewith; (6) "Redundancy Methods and Systems Calibration and Conversion with DAC Elements in an ADC" invented by Carlos Esteban Muñoz, Karl Ernesto Thompson, Douglas S. Piasecki, Wai Laing Lee, and Eric Swanson; U.S. patent application Ser. No. 09/394,809, filed on even date herewith; (7) "Precision Voltage Source Systems and Methods for Digital Calibration of Successive Approximation Analog-to-digital Systems" invented by Karl Ernesto Thompson, Carlos Esteban Muñoz, Douglas S. Piasecki, Wai Laing Lee, and Eric Swanson; U.S. patent application Ser. No. 09/393,046, filed on even date herewith.

BACKGROUND OF THE INVENTION

1. Field of the Invention

The present invention relates to multistage comparators used in analog-to-digital converters (ADCs), and more particularly relates to methods for calibrating such multistage comparators to remove the native comparator offset and charge injection offset resulting from the opening and closing of input switches during the sampling operation.

2. Description of Related Art

Comparators of the related art are well known. For example, Donald A. Kerth's U.S. Pat. No. 4,748,418 assigned to Crystal Semiconductor, discloses a quasi-autozero technique which can remove signal hysteresis in a comparator, by momentarily shorting the comparator output to ground prior to comparison. Comparators of the related art are known to use an autozero technique employing sample and hold circuits to store the comparator offset. However, when autozero and quasi-autozero techniques are combined, circuit performance is diminished.

SUMMARY OF THE INVENTION

According to one embodiment of the present invention, a multistage comparator includes a plurality of amplifiers and capacitors alternatingly coupled in series connection, each amplifier including a programmable source. A latch can be connected to the output of the last amplifier in the series, according to one embodiment of the present invention. Each stage of the multistage comparator includes a capacitor configured to perform an autozero function whereby the comparator offset voltage is reduced substantially to zero. Between each capacitor and the input of a next amplifier, there is connected an autozero switch which selectively grounds the input of the associated amplifier. Similarily, between each capacitor and the output of its preceding amplifier, there is connected a quasi-autozero switch which selectively grounds the output of the associated amplifier. According to one embodiment of the present invention, each of the amplifiers is a differential amplifier having first and second input and output connections. According to such an embodiment, each amplifier has first and second output capacitors, respectively connected to the first and second outputs of the associated differential amplifier. Further, each such differential amplifier has first and second input autozero switches connected to its respective first and second inputs; and a quasi-autozero switch connected across the first and second outputs. Further according to one embodiment of the present invention, the multistage comparator includes a latch having first and second inputs connected respectively to the first and second outputs of the last in the series of differential amplifiers. According to one embodiment of the present invention, the programmable source of a selected amplifier in a multistage comparator is calibrated by grounding the input(s) of the selected amplifier to produce an output corresponding to the amplifier offset voltage. The associated output quasi-autozero switch is closed to prevent the amplifier output voltage from being applied to the first node(s) of the associated output autozero capacitor (s), while grounding the second node or nodes of this or these capacitor(s) by closing the autozero switch(es). The resulting voltage across the autozero capacitor(s) is zero, the desired voltage after calibration. Thereafter, the autozero switch(es) are opened to sample the voltage on the autozero capacitor(s). Voltage measurements for calibrating the programmable source are made by opening the quasi-autozero switch. This allows the output of the selected amplifier to change in response to the offset voltage. The selected amplifier output is transferred to the succeeding comparator stages using AC coupling techniques via the autozero capacitor(s). According to the present invention, after the programmable source of the selected amplifier has been adjusted to accomplish calibration of said selected amplifiers's native voltage offset, another calibration operation is conducted to remove any voltage error caused by charge injection from the opening of the input autozero switch(es). The present invention accordingly improves the performance of a multistage comparator by removing undesired native voltage offset and charge injection effects. More particularly, according to the present invention, an autozeroed and quasi-autozeroed multistage comparator used for analog-to-digital conversion is calibrated to remove native voltage and charge injection offsets. The comparator is further optimized according to the present invention to enable high bandwidth and low power comparator operation by reducing offset effects in its amplifier stages. According to one embodiment of the present invention, the programmable sources are implemented as calibable current sources for removing native amplifier and charge injection offsets. After the offset is compensated by appropriate current source calibration settings (for native amplifier offset or charge injection and native amplifier offset), at a particular stage, the next preceding stage can be calibrated. According to one embodiment of the present invention, only the first stage of the multi-stage comparator is subject to calibration. According to one embodiment of the present invention, the calibrable current sources are implemented with registers associated with particular ones of the comparator stages. According to one embodiment of the present invention, the multistage comparator is a differential system.

BRIEF DESCRIPTION OF THE DRAWINGS

FIG. 3A is a block diagram of an amplifier stage in a multistage comparator, which has a programmable source, an amplifier input autozero switch, a quasi-autozero switch (QAZS), an autozero switch (AZS) connected to node 2 of the autozero capacitor, an autozero capacitor (AZC), and an ideal comparator connected to node 2 of the AZC, with each of the respective switches being held closed to discharge the autozero capacitor;

FIG. 3B is a block diagram of an amplifier stage in a multistage comparator, which has a programmable source, an amplifier input autozero switch, a quasi-autozero switch (QAZS), an autozero switch (AZS), an autozero capacitor (AZC) connected to node 2 of the autozero capacitor, and an ideal comparator connected to node 2 of the AZC, with the amplifier input autozero switch and the autozero switch being held open to store the discharge state on the autozero capacitor;

DETAILED DESCRIPTION OF THE PREFERRED EMBODIMENTS

Figure 1:
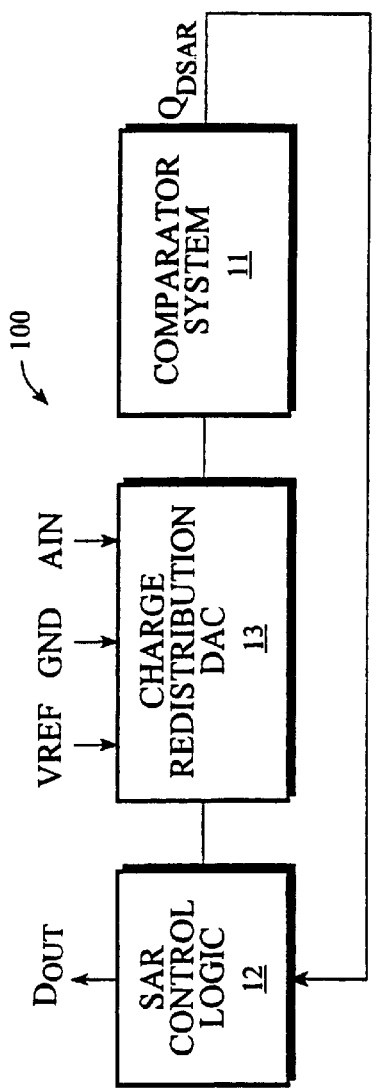
FIG. 1 is a block diagram of a successive approximation converter system including SAR control logic, a charge redistribution DAC, a latch, and a comparator, according to the present invention.

Referring now to FIG. 1, there is shown a block diagram of a successive approximation register (SAR) converter system 100 which includes a comparator system 11 according to the present invention. In particular, FIG. 1 shows a SAR converter system 100 including a comparator system 11 having an input and an output connection producing an output signal, $Q_{DSAR}$. SAR converter system 100 further includes preprogrammed SAR control logic circuitry 12 and a charge redistribution digital-to-analog converter (DAC) 13 which is for example provided with a reference voltage (VREF), a ground voltage (GND), and an input voltage (AIN), and an N-bit input control signal from the SAR control logic system 12. The charge redistribution DAC 13 particularly includes a switching system and a capacitor array connected to the output of the switching system (not shown). The capacitor array of the charge redistribution DAC 13 is configured as a binary weighted function of suitably fabricated capacitors. $D_{OUT}$ is determined one bit at a time by comparing the charge redistribution DAC output to an analog input voltage. The charge redistribution DAC output is successively incremented and accumulated from the most significant bit (MSB) to the least significant bit (LSB), until $D_{OUT}$ is an equal digital representation of AIN.

Figure 2A:
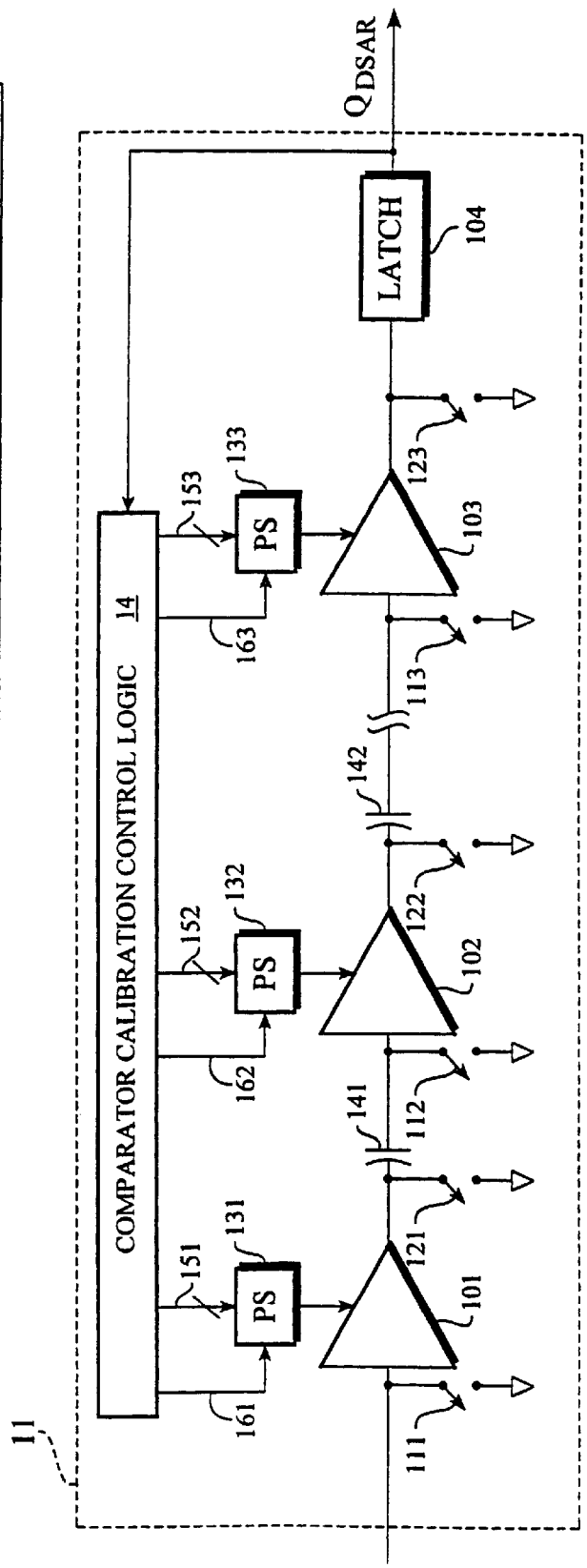
FIG. 2A is a simplified block diagram of a multistage comparator according to the present invention, which includes a plurality of amplifiers and capacitors alternatingly coupled in series connection, each amplifier including a corresponding programmable source, a latch, and comparator control logic.

Referring now to FIG. 2A, there is shown a simplified block diagram of a comparator system 11 according to the present invention. The comparator system 11 includes a comparator calibration control logic circuit 14, a plurality of amplifiers 101–103, and autozero (AZ) capacitors 141–142 which are altenatingly coupled in series connection. Each of amplifiers 101–103 includes a corresponding programmable source 131–133. According to one embodiment of the present invention, each programmable source either includes an electric current source, or an electric voltage source and a capacitor to provide an input charge increment to the amplifier associated with the programmable source. According to one embodiment of the present invention, comparator system 11 includes a plurality of series connected amplifiers 101–103 and a latch 104 which has an output connection which provides signals to the comparator calibration control logic circuitry 14 to enable calibration of the programmable sources 131–133. The programmable sources 131–133 receive calibration codes according to the present invention through respective parallel lines 151–153. Operation of the programmable sources 131–133 is enabled by control signals applied on respective signal lines 161–163. The latch 104 is connected to the last amplifier 103. The comparator system 11 further includes a programmable source 131 connected to amplifier 101, an autozero (AZ) switch 111 connected to amplifier 101, a quasi-autozero (QAZ) switch 121 connected to amplifier 101, and an AZ capacitor 141 connected to amplifier 101 and 102. The programmable source 131 is controlled by predetermined control logic instructions programmed into comparator calibration control logic circuitry 14, which is described in greater detail below. Comparator system 11 further includes an input autozero switch 112 connected to amplifier 102, a programmable source 132 connected to amplifier 102, a QAZ switch 122 connected to amplifier 102 and 103, and an autozero capacitor 142 connected to amplifier 102. The programmable source 132 is controlled by predetermined control logic instructions programmed into comparator calibration control logic circuitry 14, which is described in greater detail below. Comparator system 11 further includes an input AZ switch 113 connected to amplifier 103, a programmable source 133 connected to amplifier 103, and a QAZ switch 123 connected to amplifier 103. The programmable source 133 is controlled by predetermined control logic instructions programmed into comparator calibration control logic circuitry 14, which is described in greater detail below.

Figure 2B:
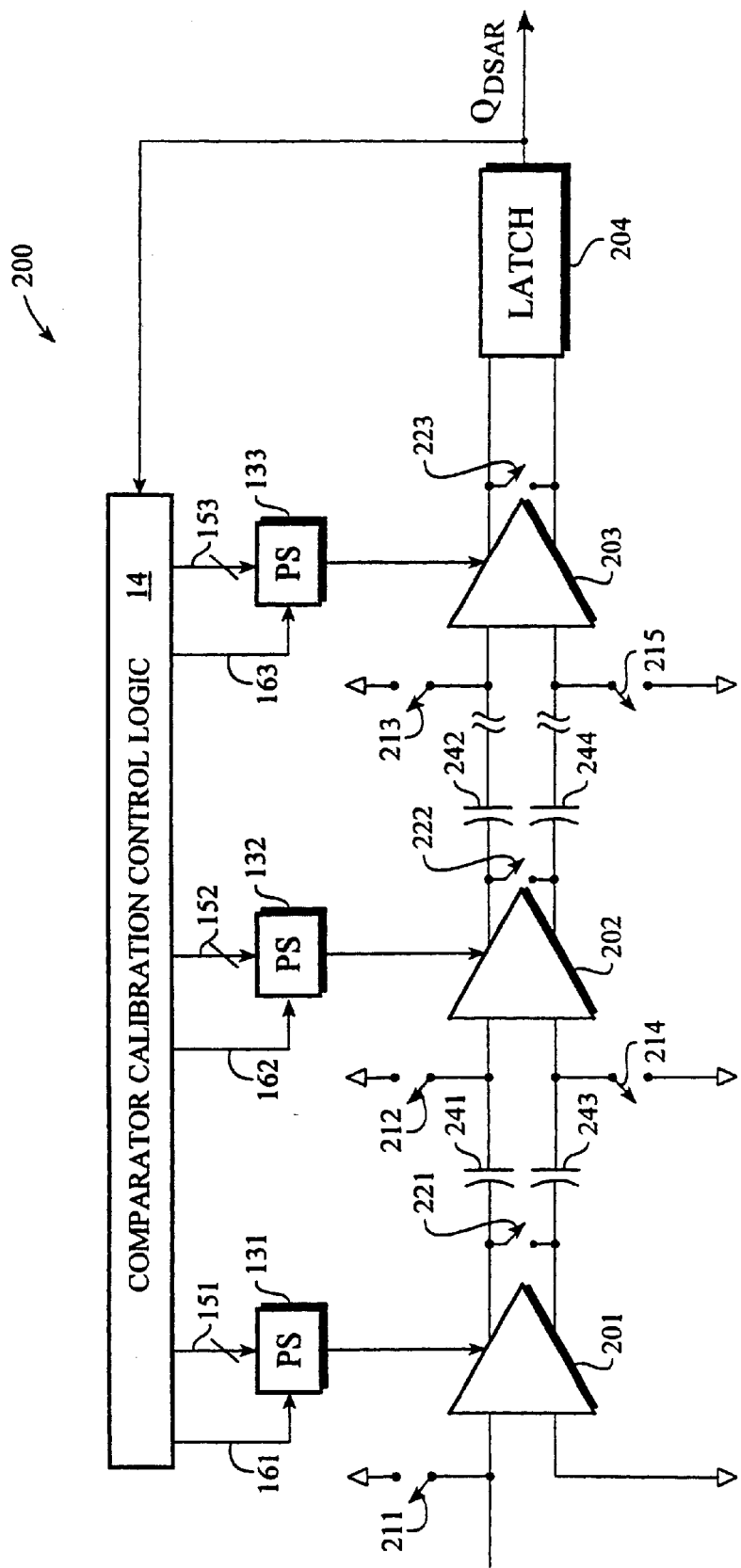
FIG. 2B is a simplified block diagram of a multistage comparator according to on embodiment of the present invention, which includes a plurality of differential amplifiers and capacitors alternatingly coupled in series connection, each differential amplifier including a corresponding programmable source, a latch, and comparator control logic.

Referring now to FIG. 2B, there is shown a simplified block diagram of a differential comparator system 200 according to the present invention, which includes a plurality of differential amplifiers 201–203 and AZ capacitor sets including capacitors 241 and 243, and 242 and 244 alternatingly coupled in series connection between successive ones of said differential amplifiers 201–203. Each differential amplifier 201–203 includes a corresponding programmable source 131–133. Differential comparator system 200 particularly includes differential amplifiers 201–203 and a differential latch 204 connected to the last differential amplifier 203. The differential comparator system 200 further includes a pair of AZ capacitors 241 and 243 connected to differential amplifiers 201 and 202; a programmable source 131 connected to amplifier 201; an AZ switch 211 connected to differential amplifier 201; and an output QAZ switch 221 connected to differential amplifier 201. Differential comparator system 200 further includes an AZ switch pair 212 and 214, connected to differential amplifier 202; a programmable source 132 connected to differential amplifier 202; a QAZ switch 222 connected to differential amplifier 202; and an AZ capacitor pair 242 and 244, connected to amplifiers 202 and 203. Differential comparator system 200 further includes an AZ switch pair 213 and 215 connected to differential amplifier 203; a programmable source 133 connected to amplifier 203; a QAZ switch 223 connected to differential amplifier 203 which in turn is connected to differential latch 204. As shown in FIG. 2B, differential comparator system 200 according to the present invention further includes a comparator calibration control logic circuit 14, for the programming of corresponding programmable source 131–133. According to one embodiment of the present invention, each programmable source either includes an electric current source, or an electric voltage source and capacitor to provide an input charge increment to the differential amplifier associated with the programmable source. According to one embodiment of the present invention, differential comparator system 200 includes a plurality of differential amplifiers 201–203 and a differential latch 204 which has an output connection which provides signals to the comparator calibration control logic circuitry 14 to enable calibration of the programmable sources 131–133. The programmable sources 131–133 receive calibration codes according to the present invention through respective parallel lines 151–153. Operation of the programmable sources 131–133 is enabled by control signals applied on respective signal lines 161–163. The differential latch 204 is connected to the last differential amplifier 203.

Figure 2C:
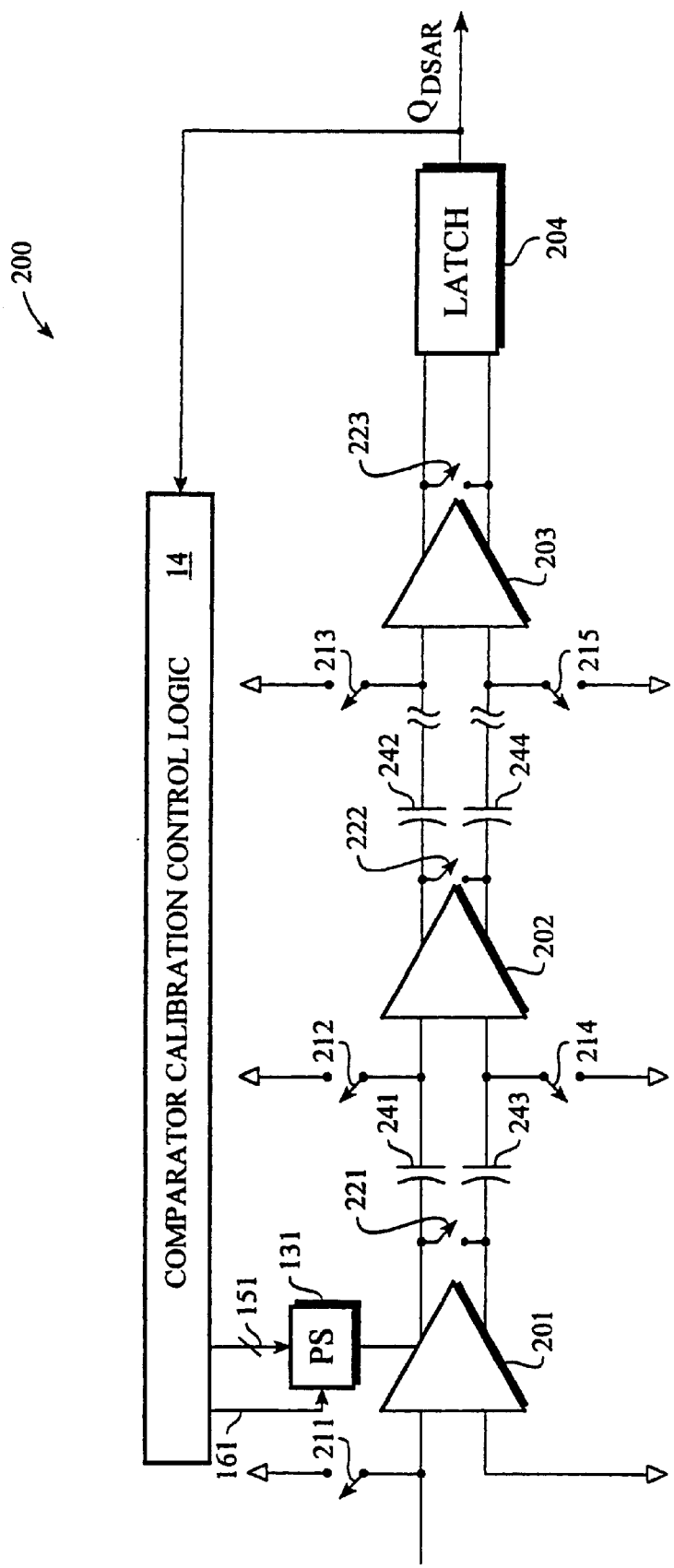
FIG. 2C is a simplified block diagram of a multistage comparator according to on embodiment of the present invention, which includes a plurality of differential amplifiers and capacitors alternatingly coupled in series connection, and only the first differential amplifier having a corresponding programmable source, a latch, and comparator calibration control logic

Referring now to FIG. 2C, there is shown a simplified block diagram of a differential comparator system 200 according to the present invention, which includes a plurality of differential amplifiers 201–203 and AZ capacitor sets including capacitors 241 and 243, and 242 and 244, alternatingly coupled in series connection between successive ones of said differential amplifiers 201–203. Differential comparator system 200 more particularly includes differential amplifiers 201–203; a differential latch 204 connected to the last differential amplifier 203; a set of AZ capacitors 241 and 243 connected to differential amplifiers 201 and 202; a programmable source 131 connected to differential amplifier 201; an AZ switch 211 connected to differential amplifier 201; and an output QAZ switch 221 connected to differential amplifier 201. Differential comparator system 201 further includes an AZ switch set 212 and 214, connected to differential amplifier 202; a QAZ switch 222 connected to differential amplifier 202; and an AZ capacitor pair 242 and 244, connected to differential amplifiers 202 and 203. Differential comparator system 200 further includes an input AZ switch pair 213 and 215 connected to differential amplifier 203; and a QAZ switch 223 connected to differential amplifier 203 and to differential latch 204. As shown in FIG. 2C, differential comparator system 200 according to the present invention further includes a comparator calibration control logic circuit for programming the programmable source 131. According to one embodiment of the present invention, the programmable source either includes an electric current source or an electric voltage source and capacitor to provide an input charge increment to the differential amplifier associated with the programmable source. According to one embodiment of the present invention, differential comparator system includes a plurality of differential amplifiers 201–203 and a differential latch 204 which has an output connection that provides signals to the comparator calibration control logic circuitry to enable calibration of the programmable source 131. The programmable source 131 receives calibration codes according to one embodiment of the present invention through a parallel line 151. Operation of the programmable source is enabled by control signals applied on line 161. The differential latch 204 is connected to the last differential amplifier 203.

Figure 2D:
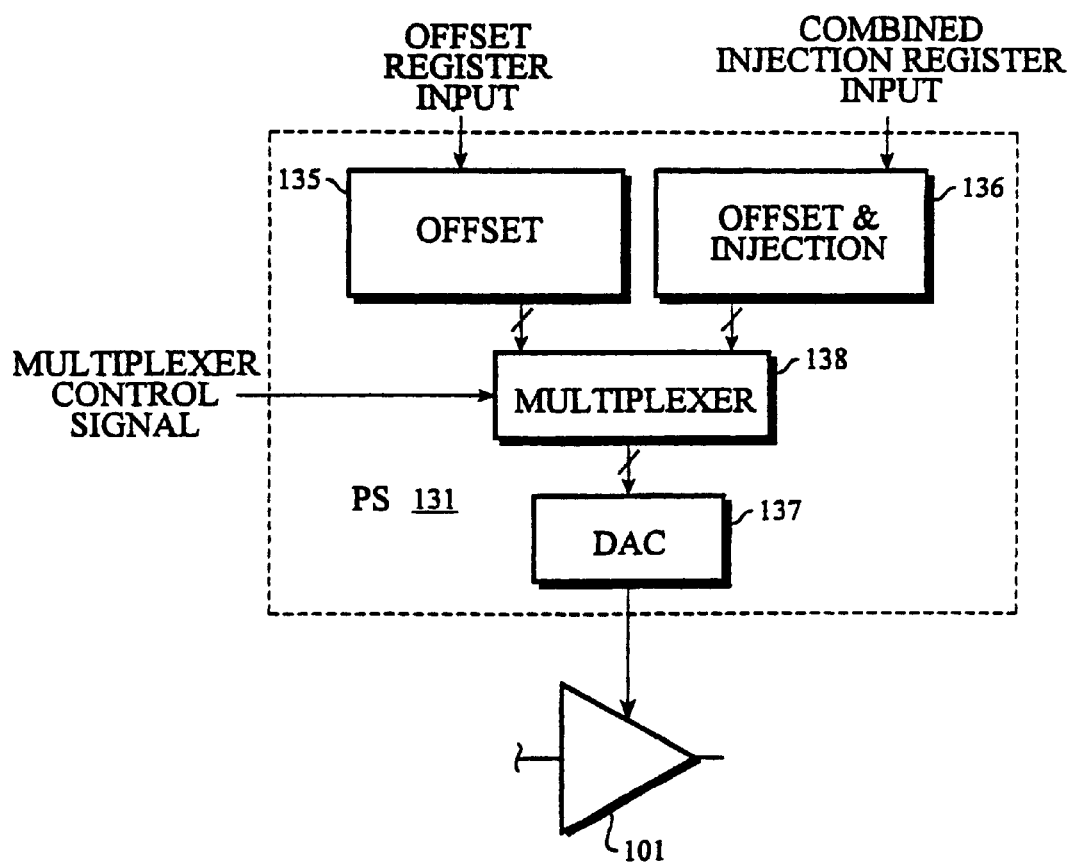
FIG. 2D is a block diagram of a programmable source according to one embodiment of the present invention.

Referring now to FIG. 2D, there are shown particular details of a programmable source as invented herein. According to one embodiment of the present invention, a programmable source 131 as shown in FIG. 2D includes an offset register 135, an offset and injection register 136, a DAC 137, and a multiplexer connecting offset register 135 and offset & injection register 136 with DAC 137, according to the values of a multiplexer control signal. Each of the registers 135 and 136 can selectively control the amount of current provided by DAC 137 to a particular amplifier in a comparator system operating in accordance with the present invention. In particular, the programmable source 131 provides a current source for eliminating the offset voltage alone through register 135 and a current source for eliminating the offset voltage in combination with the injection charge through register 136. Programmable source 131 further includes a multiplexer 138 and a DAC 137. The DAC 137 provides either a current for offset cancellation or a current for cancellation of the offset and injection which is applied to the amplifier. According to one embodiment of the present invention, the programmable source current is applied to the output of a particular amplifier. Each of the registers 135 and 136 can selectively control the amount of current provided by DAC 137 to the applicable amplifier. Offset register 135 is provided with an offset register input value, and offset and injection register 136 is provided with a combined offset and injection register input value, by calibration according to the present invention as discussed below in detail.

Figure 3C:
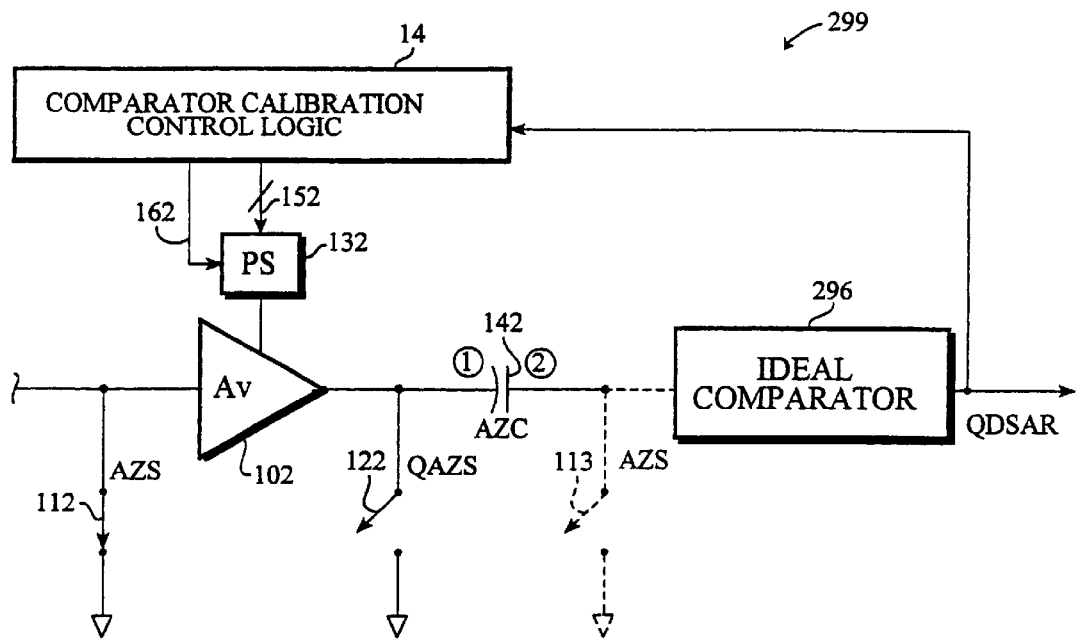
FIG. 3C is a block diagram of an amplifier stage in a multistage comparator, which has a programmable source, an autozero switch connected to the amplifier input, a quasi-autozero switch (QAZS), an autozero switch (AZS) connected to node 2 of the autozero capacitor, an autozero capacitor (AZC), and an ideal comparator connected to node 2 of the AZC, with the autozero switch connected to node 2 of the autozero capacitor and the quasi-autozero switch being held open, and the autozero switch connected to the amplifier input being held closed, the input to the ideal comparator transitioning from zero volts to a voltage equivalent to the amplifier gain multiplied by the amplifier offset.

Referring now to FIGS. 3A–3C, there are shown block diagrams of an amplifier calibration system 299 according to one embodiment of the present invention, in which the offset of amplifier 102 is removed by the appropriate programming of the programmable source 132. The amplifier calibration system 299 in FIGS. 3A–3c according to one embodiment of the present invention includes and amplifier 102 having gain Av; an ideal comparator 296; and an AZ capacitor 142 connected to amplifier 102 and ideal comparator 296; a pair of AZ switchs 112–113 connected to amplifier 102 and the ideal comparator respectively; a QAZ switch 122 connected to amplifier 102; a programmable source 132 connected to amplifier 102; and a comparator calibration control logic circuit 14 for programming the programmable source 132. The operation of the amplifier calibration system 299 for the removal of the native amplifier offset is described with reference to FIGS. 3A–3C, as follows. comparator calibration control logic circuitry 14 and a programmable source 132 connected to the comparator calibration control logic circuitry 14. The programmable source 132 is connected to an amplifier 102 having gain Av, and the amplifier 102 is in turn connected to an ideal comparator 296. The ideal comparator is connected to comparator calibration control logic circuitry 14 for programming the programmable source 132. Amplifier system 299 according to the present invention includes a quasi-autozero switch 122, an autozero capacitor 142, and an autozero switch 113. The ideal comparator 296 compares the output voltage from amplifier 102 to zero, and the comparator calibration control logic 14 determines a calibration value for programmable source 132 through line 152 which will inject charge or current into amplifier 102 to remove its native offset and any charge injected at autozero capacitor 142 by opening autozero switch 112. Under a programming method according to the present invention, offset calibration is started, and the amplifier outputs are tracked Tracking the amplifier outputs includes closing the autozero switch and the quasi-autozero switch of the amplifier stage being calibrated to a null output. Such tracking further includes closing the autozero switches of the amplifier stages succeeding the amplifier stage being calibrated to produce an output substantially equal to the offset. Tracking further includes closing the autozero switches and the quasi-autozero switches of the amplifier stages preceding the amplifier stage being calibrated to null the outputs thereof.

Referring to FIG. 3A, there is shown a block diagram of the amplifier calibration system 299 with the switches configured in a track mode. The AZ switches 112 and 113, and the QAZ switch 122 are held closed. The AZ switch 112 being held closed forces the output of amplifier 102 equal to the product of the amplifier gain (Av) and the amplifier offset (Vos), i.e., Av*Vos. The QAZ switch 122 being held closed shorts the amplifier output to ground. The AZ switch 113 in conjunction with the Qaz switch being held closed forces the differential voltage across the AZ capacitor 142 to zero, the desired voltage after calibration. The AZ switch 113 being held closed forces the output of the ideal comparator to zero.

Referring now to FIG. 3B, there is shown a block diagram of amplifier calibration system 299 with the switches configured in hold mode, according to one embodiment of the present invention. The AZ switch 112 and QAZ switch 122 are held closed, and the AZ switch 113 is held open. The opening of the AZ switch 113 holds the differential voltage across the AZ capacitor during a track mode according to the present invention, with an add error due to the charge injection from the AZ switch 113. The charge injection error from the AZ switch 113 appears as an additional output offset voltage (Vinj1) from amplifier 102 at node 2 of AZ capacitor 142.

Referring to FIG. 3C, there is shown a block diagram of amplifier calibration system 299 with the switches configured in a measure mode according to one embodiment of the present invention. The AZ switch 112 is shown hled closed and the AZ switch 113 and the QAZ switch 122 is held open. The openning of the QAZ 122 allows the output of amplifier 102 to change to Av*Vos and node 2 of AZ capacitor 142 to change to Av*Vos+Vinj1. The ideal comparator compares the voltage at node 2 of AZ capacitor 142 to zero and produces an output for the comparator calibration control logic circuit 14. The steps detailed in FIGS. 3A–3C are repeated a sufficient number of times as necessary to remove sampling errors caused by opening AZ switch 113. The comparator calibration control logic circuit 14 averages the measured outputs to determine a calibration value for the programmable source 132 which is applied through line 152. According to one embodiment of the present invention, line 152 comprises a plurality of parallel signal lines.

Figure 4A:
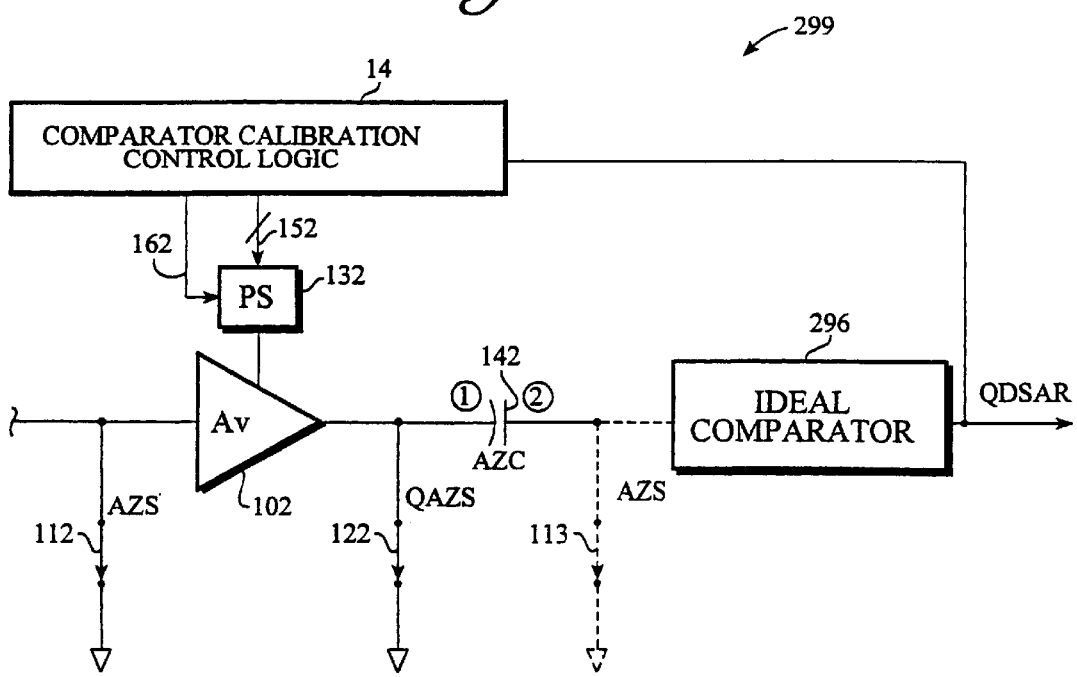
FIG. 4A is a block diagram of an amplifier stage in a multistage comparator, which has a programmable source, an amplifier input autozero switch, a quasi-autozero switch (QAZS), an autozero switch (AZS) connected to node 2 of the autozero capacitor, an autozero capacitor (AZC), and an ideal comparator connected to node 2 of the AZC, with each of the respective switches being held closed to discharge the autozero capacitor.
Figure 4B:
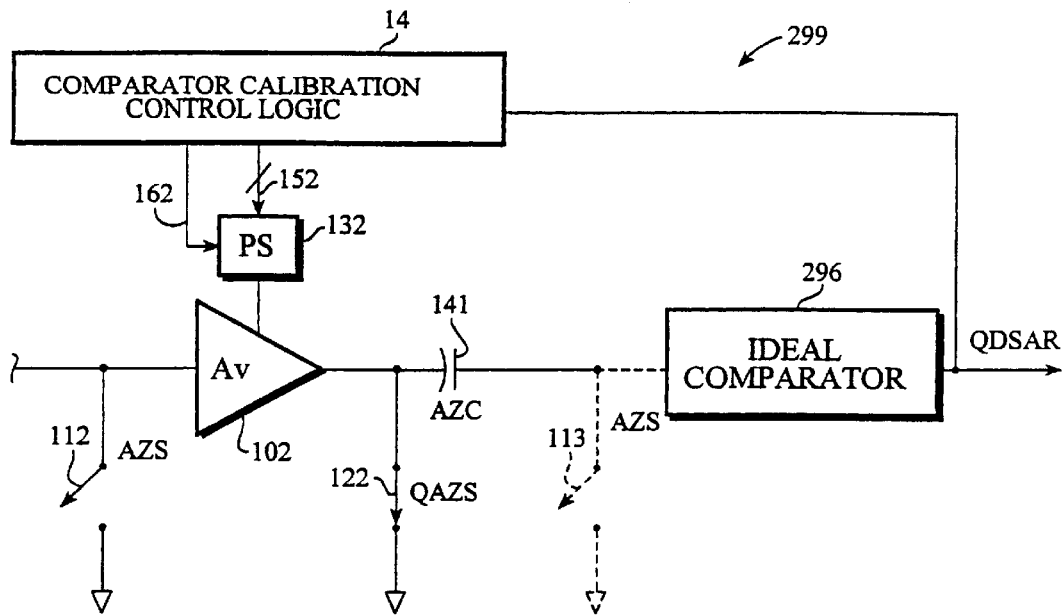
FIG. 4B is a block diagram of an amplifier stage in a multistage comparator, which has a programmable source, an amplifier input autozero switch, a quasi-autozero switch (QAZS), an autozero switch (AZS), an autozero capacitor (AZC) connected to node 2 of the autozero capacitor, and an ideal comparator connected to node 2 of the AZC, with the amplifier input autozero switch and the autozero switch being held open to store the discharge state on the autozero capacitor, wherein the autozero switch connected to the input of the amplifier is open.
Figure 4C:
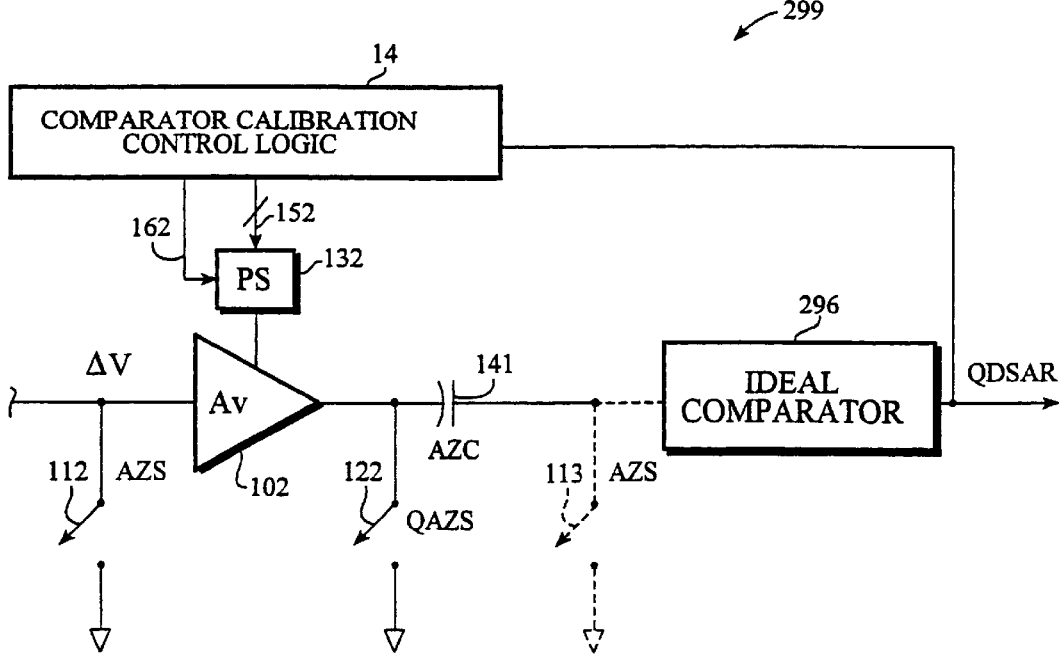
FIG. 4C is a block diagram of an amplifier stage in a multistage comparator, which has a programmable source, an autozero switch connected to the amplifier input, a quasi-autozero switch (QAZS), an autozero switch (AZS) connected to node 2 of the autozero capacitor, an autozero capacitor (AZC), and an ideal comparator connected to node 2 of the AZC, with the autozero switch connected to node 2 of the autozero capacitor and the quasi-autozero switch being held open, and the autozero switch connected to the amplifier input being held closed, the input to the ideal comparator transitioning from zero volts to a voltage equivalent to the amplifier gain multiplied by the amplifier offset, wherein the autozero switch is connected to the input of the amplifier being open, the voltage being applied is the amplifier gain multiplied by the sum of the amplifier offset and the autozero switch charge injection.

Referring now to FIGS. 4A–4C, there are shown block diagrams of an amplifier calibration system 299 according to one embodiment of the present invention in which the offset of amplifier 102 and charge injection of AZ switch 112 are removed by the programming of the programmable source 132 in accordance with the present invention. The amplifier calibration system in FIGS. 4A–4C according to one embodiment of the present invention includes an amplifier 102 having a gain Av; an ideal comparator 296; an AZ capacitor 142 connected to amplifier 102 and ideal comparator 296; a pair of AZ switches 112 and 113 which are connected to amplifier 102 and the ideal comparator respectively; a QAZ switch 122 connected to amplifier 102; a programmable source 132 connected to amplifier 102; and a comparator calibration control logic circuit 14 for programming the programmable source 132. Details of operation of the amplifier calibration system 299 for the removal of the native amplifier and AZ switch charge injection offsets is described below with respect to FIGS. 4A–4C.

Referring particularly to FIG. 4A, there is shown a block diagram of the amplifier calibration system 299 with the switches configured in track mode. The AZ switches 112 and 113 and the QAZ switch are held closed. The switch configuration details for FIG. 4A are analogous to the details of FIG. 3A above.

Referring to FIG. 4B, there is shown a block diagram of the amplifier calibration system 299 with the switches configured in a hold mode according to the present invention. The QAZ switch 122 is particularly held in a closed state while the AZ switches 112 and 113 are held in open states. By opening AZ switch 113, the differential voltage detected is held across the AZ capacitor during a track mode with an add error due to the charge injection from AZ switch 113. The charge injection error from the AZ switch 113 appears as an additional output referred offset on amplifier 102 (Vinj1) at node 2 of AZ capacitor 142. Opening AZ switch 112 creates a charge injection error at the input of amplifier 102 which appears as an additional input referral offset voltage (Vinj2) on amplifier 102.

Referring to FIG. 4C, there is shown a block diagram of the amplifier calibration system 299 with the switches configured in a measure mode. The AZ switches 112 and 113 and the QAZ switch 122 are held in an open state. By opening QAZ switch 122, the output of amplifier 102 is permitted to change to Av*(Vos+Vinj2) and node 2 of AZ capacitor 142 is permitted to change to Av*(Vos+Vinj2)+Vinj1. The ideal comparator compares the voltage at node 2 of AZ capacitor 142 to zero and produces an output for the comparator control logic circuit 14. The steps detailed in FIGS. 4A–4C are repeated a sufficient amount of times to remove sampling errors caused by the opening of AZ switches 112 and 113. The comparator calibration control logic circuit 14 averages the measured outputs to determine a calibration value for the programmable source 132.

Figure 5:
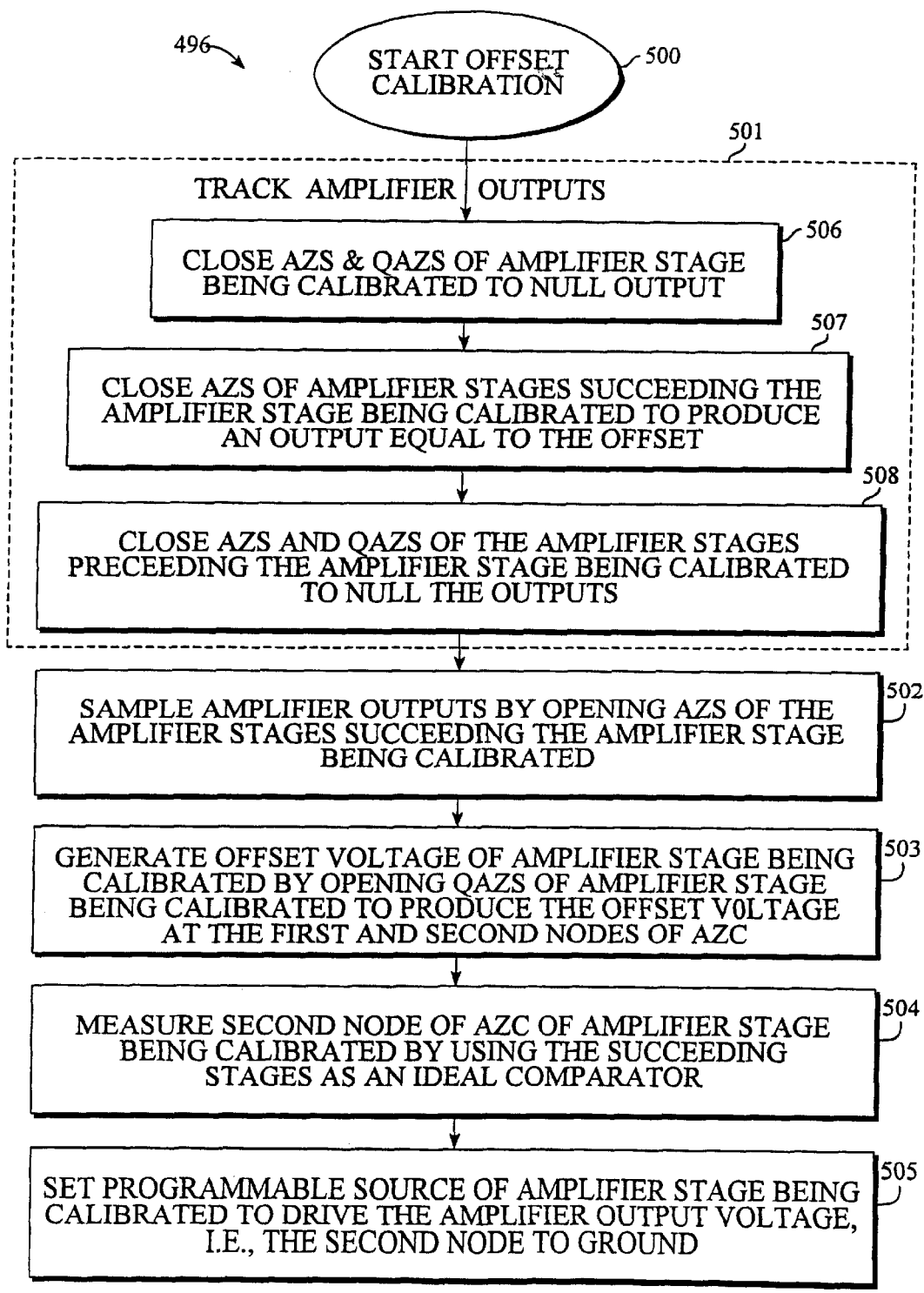
FIG. 5 is a flow chart of a method of programming a programmable source for cancellation of the amplifier offset.

Referring now to FIG. 5, there is shown a method 496 of programming the value of a programmable source for a particular amplifier is a multistage comparator according to one embodiment of the present invention. Under a programming method 496 according to the present invention, offset calibration is started 500, and the amplifier outputs are tracked 501. Tracking 501 the amplifier outputs includes closing 506 the autozero switch and the quasi-autozero switch of the amplifier stage being calibrated to a null output. Such tracking 501 further includes closing 507 the autozero switches of the amplifier stages succeeding the amplifier stage being calibrated to produce an output substantially equal to the offset. Tracking 501 further includes closing 508 the autozero switches and the quasi-autozero switches of the amplifier stages preceding the amplifier stage being calibrated to null the outputs thereof. Further under a programming method 496 according to the present invention, the amplifier outputs are sampled by opening 502 the autozero switches of the amplifier stages succeeding the amplifier stage being calibrated. Additionally, the offset voltage of the amplifier stage being calibrated is generated 503 by opening the quasi-autozero switch of the amplifier stage being calibrated to produce the offset voltage at the first and second nodes of the autozero capacitor. Further, the second node of the autozero capacitor of the amplifier stage being calibrated is measured 504, by using the succeeding stages as an ideal comparator. Finally, the programmable source of the amplifier stage being calibrated is set 505 to drive the amplifier output voltage, i.e., the second node, to ground. In summary, to enable tracking of amplifier outputs, the input connections of a selected comparator system amplifiers are grounded. This input grounding action produces an output offset voltage for the amplifier which may have alternating current (AC) and direct current (DC) components. While the input is grounded and an offset voltage is produced at the output. Further, the output quasi-autozero switch at the amplifier output and at a first node of the autozero capacitor for particular amplifier, is opened. Substantially concurrently, the second autozero capacitor node of the applicable autozero capacitor is closed to ground. Next, the autozero switch of the second autozero capacitor node is opened while the quasi-autozero switch is kept open. Then, the autozero switch is closed to establish a negative value of the output AC, DC voltage at the second associated autozero capacitor node. Next, the second autozero capacitor node is measured. Then, the associated programmable source is adjusted to a value calculated to drive the applicable amplifier output voltage (i.e., the voltage at the second AZC node) to ground. Accordingly, calibration of the particular programmable source for one of several amplifiers is accomplished by completion of the indicated operations.

Figure 6:
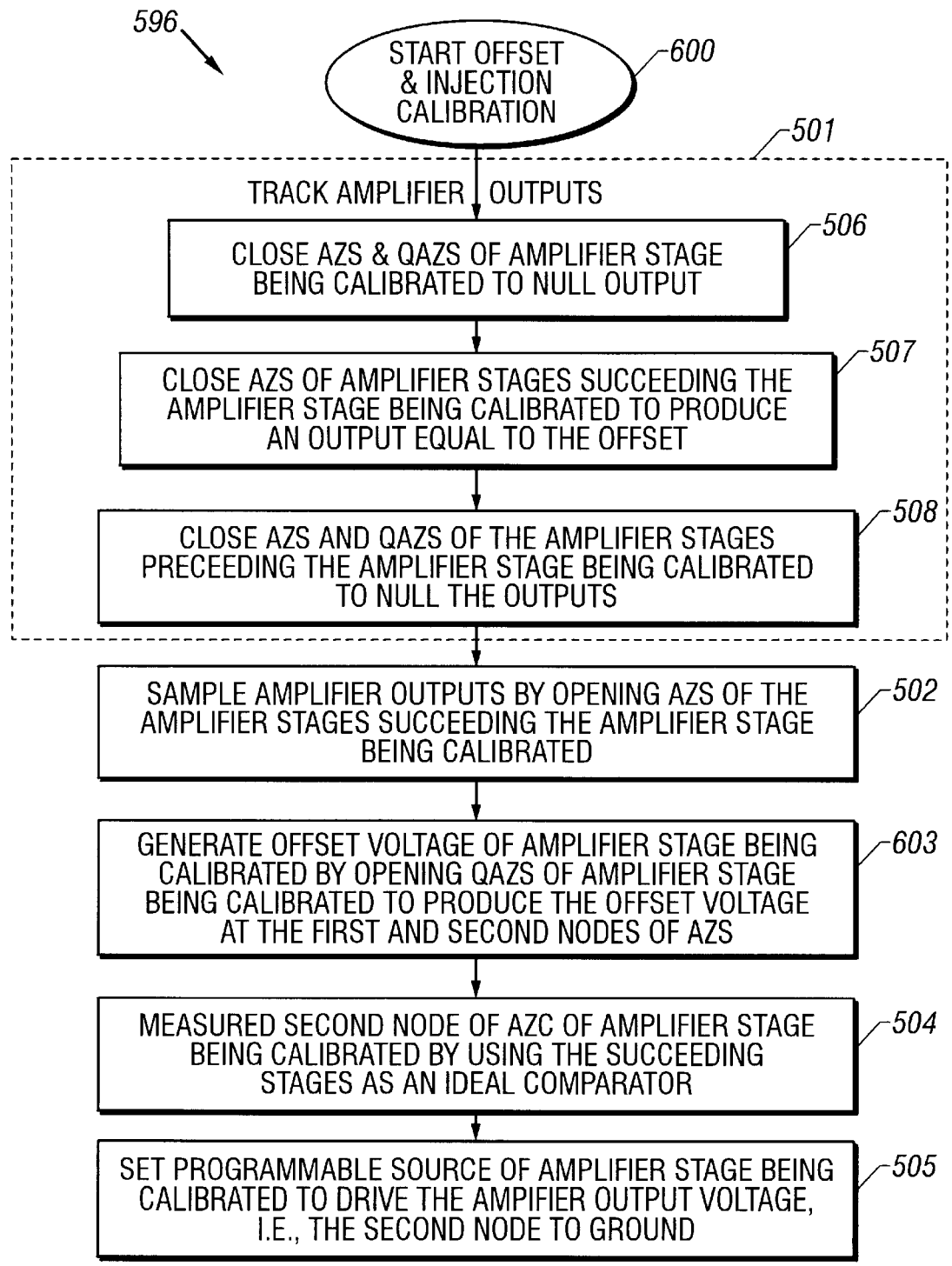
FIG. 6 is a flow chart of a method of programming a programmable source for cancellation of the amplifier offset and autozero switch charge injection.

Referring now to FIG. 6, there is shown a method 496 of programming the value of a programmable source for a particular amplifier is a multistage comparator according to one embodiment of the present invention. Under a programming method 596 according to the present invention, offset and injection calibration is started 600, and the amplifier outputs are tracked 501. Tracking 501 the amplifier outputs includes closing 506 the autozero switch and the quasi-autozero switch of the amplifier stage being calibrated to a null output, i.e., to zero volts (0V). Such tracking 501 further includes closing 507 the autozero switches of the amplifier stages succeeding the amplifier stage being calibrated to produce an output substantially equal to the offset. Tracking 501 further includes closing 508 the autozero switches and the quasi-autozero switches of the amplifier stages preceding the amplifier stage being calibrated to null the outputs thereof, i.e., to set them equal to zero volts (0V). Further under a programming method 596 according to the present invention, the amplifier outputs are sampled by opening 502 the autozero switches of the amplifier stages succeeding the amplifier stage being calibrated. Additionally, the offset and injection voltage of the amplifier stage being calibrated is generated 603 by opening the quasi-autozero switch of the amplifier stage being calibrated to produce the offset voltage at the first and second nodes of the autozero capacitor. Further, the second node of the autozero capacitor of the amplifier stage being calibrated is measured 504, by using the succeeding stages as an ideal comparator. Finally, the programmable source of the amplifier stage being calibrated is set 505 to drive the amplifier output voltage, i.e., the second node, to ground. In summary, a programmable source according to one embodiment of the present invention is calibrated. According to one embodiment of the present invention, a voltage offset calibration value is determined for a selected programmable source, thus providing an electrical adjustment to a selected single amplifier (SA). The calibration value is determined by grounding the input autozero switch for the particular amplifier to ground potential, and keeping the amplifier input grounded during programmable source calibration. Thereafter, according to the method of the invention, a combined voltage offset and charge injection calibration value is determined for the programmable source associated with the selected amplifier. This combined voltage offset and charge injection calibration value is established by grounding the selected amplifier and closing an input autozero switch leading to the amplifier. Thereafter, the input autozero switch is reopened. This causes the input autozero capacitor associated with the particular amplifier being calibrated, to be temporarily loaded at its second node with an unknown charge injection error quantity. According to one embodiment of the present invention, this is followed by making a measurement of the output voltage of the amplifier with an ideal comparator or the like, and creation of an associated combined voltage offset and charge injection calibration value which takes into account voltage offset and charge injection, by action of predetermined control logic.

Figure 7A:
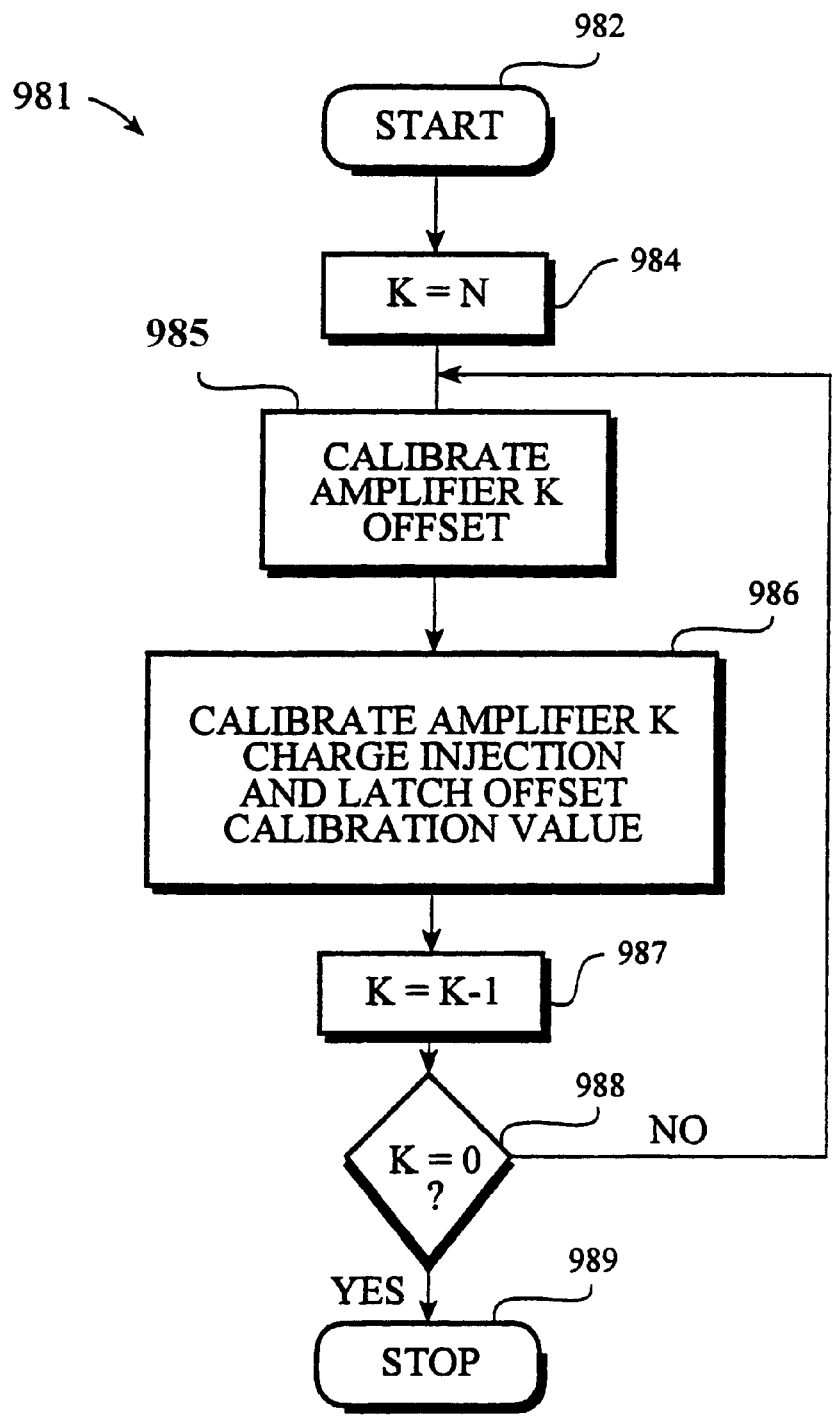
FIG. 7A is a flow chart of a method of programming each programmable source in a multi-stage comparator for the cancellation of both the amplifier offset and the autozero switch charge injection.

Referring now to FIG. 7A, there is shown a method of comparator system calibration 981 according to one embodiment of the present invention. In particular, according to one embodiment of the present invention, method 981 starts 982 and identifies 984 the number of amplifiers to be calibrated as the by setting K equal to the designation value N. Then, the Kth (i.e., the last) amplifier stage is native offset calibrated 985 to determine the particular offset value which can remove the native voltage offset at the Kth amplifier stage. A value N represents the number of amplifier stages in the comparator system according to one embodiment of the present invention. The value N is set equal to an incrementally reduceable index integer variable K, which establishes the number of loop calibration cycles performed according to one embodiment of the present invention. This number is equal to the number of amplifier stages in the multistage comparator. Accordingly, the Kth amplifier (i.e., the "last" amplifier) is native offset calibrated 985 to determine a register value used to compensate for or eliminate the effects of a characteristic referred to as voltage offset. This voltage offset feature characterizes the native condition as to offset voltage for the particular amplifier stage. The calibrated register value which is thus determined is used during operation to remove the voltage offset encountered by the Kth amplifier, when the autozero switches are not reopened after sampling. Next, the Kth amplifier is more comprehensively calibrated 986 to enable compensation for both offset and charge injection effects. Thereafter, the index value K is decremented or reduced 987 by one integer value according to one embodiment of the present invention, and a check is made 988 whether or not the index K already equals zero. If yes, operation is halted for method 981, as all amplifier stages will have been calibrated to remove voltage offset and charge injection effects. If K remains positive 988, calibration according to steps 496–986 and index reduction under step 987 is repeated for as many cycles as is required to reduce the index variable K to zero. Accordingly, the entire multistage comparator and each amplifier and the latch is effectively calibrated for both native offset and charge injection. According to another embodiment of the present invention, one of steps 496 and 986 is eliminated, and calibration is performed for native offset alone or for charge injection alone.

Figure 7B:
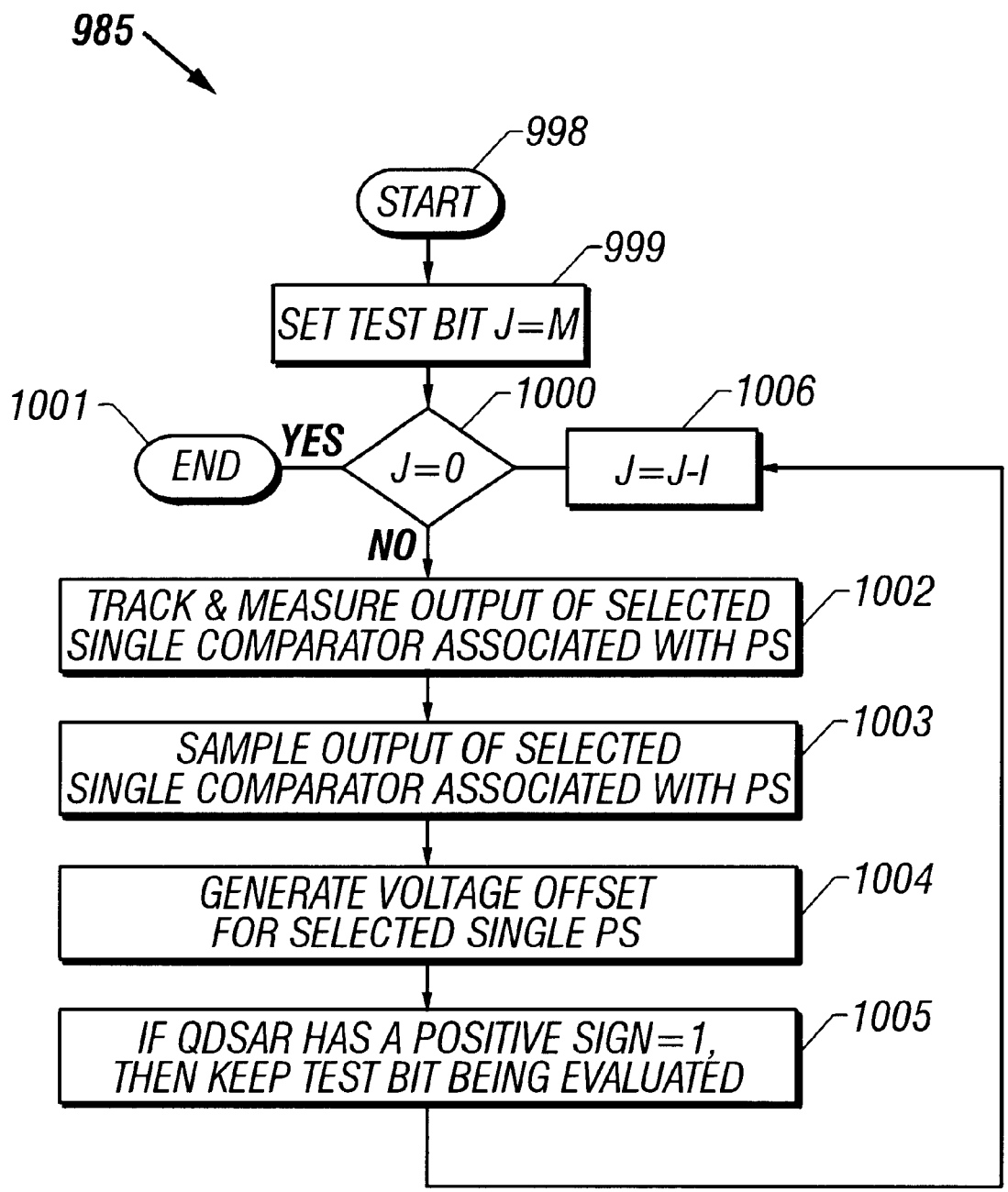
FIG. 7B is a flow chart of a method for determining the offset calibration of a single m-bit programmable source.

Referring now to FIG. 7B, there is shown a method of comparator system native offset calibration 985 for a a single M-bit programmable source, according to one embodiment of the present invention. In particular, according to one embodiment of the present invention, method 985 starts 998 and sets a first test bit j equal to the maximum number M of test bits used for calibtration. Next, a determination is made 1000 whether j is equal to zero, and if so, the calibration is completed and accordingly ends 1001. If j is not zero, tracking and a single output measurement is undertaken 1002 of the comparator associated with the particular programmable source. Next, a sample output is obtained 1003 from the selected single comparator associated with the selected programmable source. Thereafter a voltage offset is generated 1004 with the selected single programmable source. If the QDSAR signal produced as a result of the voltage offset generation is positive, the particular test bit being evaluated is kept 1005.

Figure 7C:
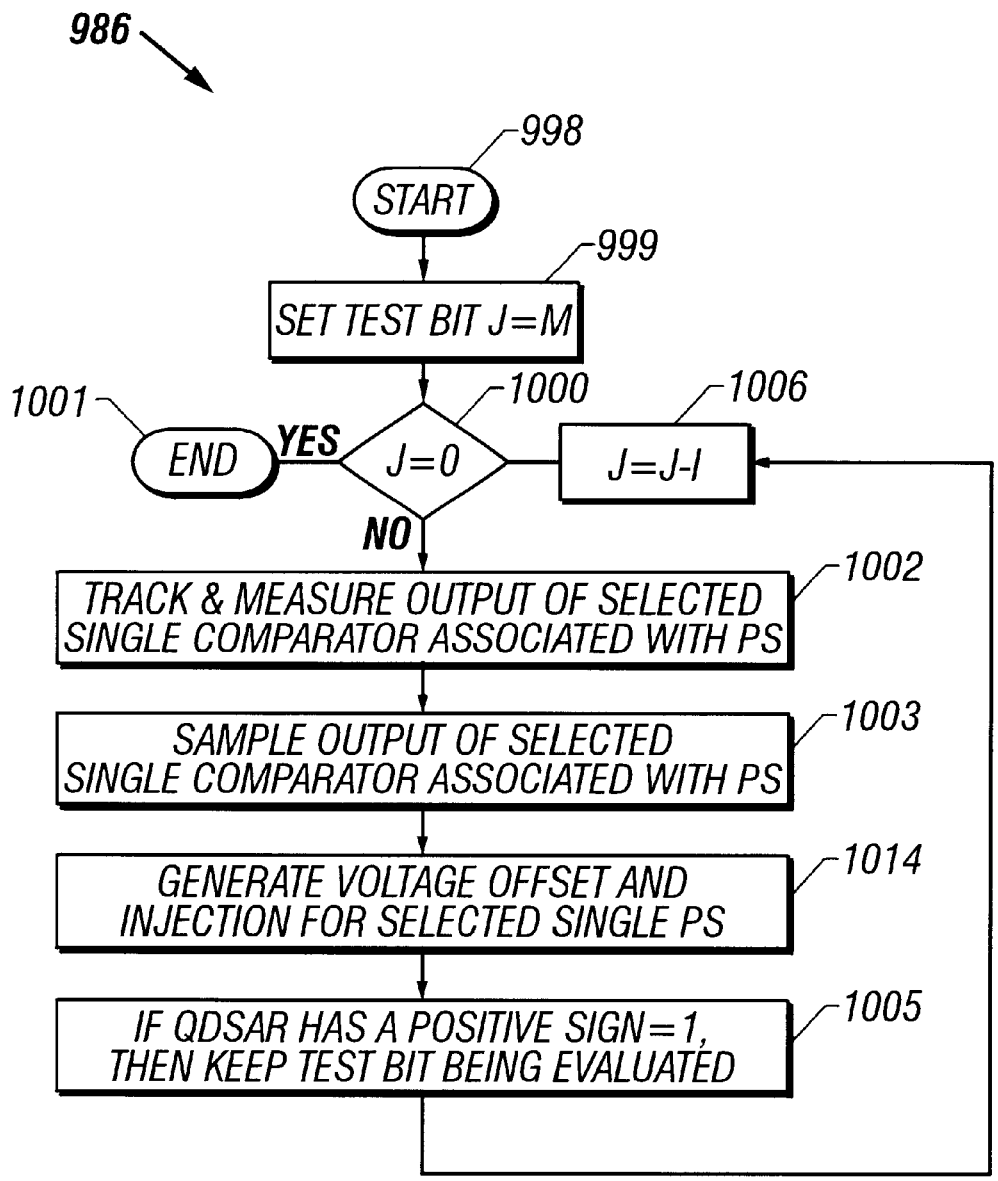
FIG. 7C is a flow chart of a method for determining the offset and charge injection calibration of a single m-bit programmable source.

Referring now to FIG. 7C, there is shown a method of comparator system offset and injection calibration 986 for a a single M-bit programmable source, according to one embodiment of the present invention. In particular, according to one embodiment of the present invention, method 986 starts 998 and sets a first test bit j equal to the maximum number M of test bits used for calibtration. Next, a determination is made 1000 whether j is equal to zero, and if so, the calibration is completed and accordingly ends 1001. If j is not zero, tracking and a single output measurement is undertaken 1002 of the comparator associated with the particular programmable source. Next, a sample output is obtained 1003 from the selected single comparator associated with the selected programmable source. Thereafter a voltage offset and charge injection value is generated 1014 with the selected single programmable source. If the QDSAR signal produced as a result of the voltage offset generation is positive, the particular test bit being evaluated is kept 1005.

What is claimed is:

1. An amplifier system including:
    a amplifier having an amplifier input, an amplifier output, and an amplifier connection node (CAN) for a programmable source, the amplifier being subject to an offset voltage;
    an autozero switch having an autozero input, an autozero output, and an autozero control node for controlling the opening and closing of the autozero switch, said autozero output being connected to said amplifier input, said autozero switch producing charge during switching action;
    an autozero capacitor including first and second nodes, said second node being connected to the amplifier input and said autozero output; and
    a programmable source connected to said amplifier, for providing an adjustment to remove at least a portion of the offset voltage to which said amplifier is subjected.

2. The amplifier system according to claim 1 wherein said programmable source additionally enables adjusting the removal of electrical charge produced during switching action of the autozero switch.

3. A method of calibrating a multistage comparator comprising a plurality of amplifiers including first through last amplifiers each including a autozero switch (AZS) having open and closed states, said method including:
    determining an amplifier adjustment for a last one of said plurality of amplifiers, which produces a zero signal output in response to a zero signal input for the last one of said plurality of amplifiers; and
    determining additional amplifier adjustments for corresponding preceding ones of said plurality of amplifiers, to produce a zero signal output for each succeeding one of said amplifiers in response to a zero voltage input to successive ones of said amplifiers.

4. The method according to claim 3 including storing selected ones of said adjustments at predetermined memory locations.

5. The method according to claim 3 including producing an electric current for making an amplifier adjustment.

6. The method according to claim 3 including producing an electric voltage for making an amplifier adjustment with charge stored on a capacitor.

7. A method of calibrating a selected amplifier in a multistage comparator which has a plurality of series connected amplifiers in the multistage comparator and a latch connected to at least one amplifier in the plurality of series connected amplifiers, said method comprising:

opening an input switch to said latch;

incrementing an amount of an adjustment and sampling an output of the latch repeatedly until the latch output cancels sufficiently to cause a change in sign, resulting in reducing any voltage offset in said latch;

grounding the inputs of each amplifier of said multistage comparator;

grounding the output of each amplifier to autozero the amplifier;

determining a value of an adjustment to be applied at the input of a selected amplifier;

closing a quasi autozero switch associated with the selected amplifier; and enabling sampling with the selected amplifiers.

8. The method of claim 7 further comprising:

after calibrating a particular amplifier, grounding and opening the input switch to the immediately preceding amplifier;

grounding the outputs of each amplifier to produce an autozero condition during tracking operation with the tracking switches closed;

determining the value of an offset voltage to be applied to the input of the particular amplifier a zero output voltage value for the amplifier;

closing the quasi autozero switch; and enabling sampling.

9. The method of operating a precalibrated, multistage comparator having a plurality of series connected amplifiers, at least one of said plurality of series connected amplifiers being precalibrated with a predetermined characteristic adjustment value, and each amplifier having an amplifier input and an amplifier output, said method comprising:

autozeroing each amplifier in a multistage comparator by electrically shorting the output of each amplifier in the multistage comparator;

providing an input voltage to said multistage comparator for comparator operation; and applying a preprogrammed adjustment to at least a single amplifier in the multistage comparator to remove an offset condition affecting said at least a single amplifier.

10. A comparator system comprising:

a plurality of series connected amplifiers, each including an output node and an input node, an input autozero switch connected to each said input node, an output groundable switch connected to said output node, an output capacitor connected to said ON, an adjustment mechanism for producing an adjustment to cancel any offset voltage produced in the associated amplifier; and a latch selectably coupleable to at least one of said plurality of series connected amplifiers.

11. A differential comparator comprising:

a plurality of series connected differential amplifiers, each including a differential output node and a differential input node, an input autozero switch connected to said differential input node, an output groundable differential switch connected to said output node, an output capacitor set connected to said differential output node;

an adjustment mechanism, connected to at least one of the differential amplifiers at a node different from the differential output node and the differential input node, for producing an adjustment to cancel any offset voltage produced in an associated one of said plurality of series connected differential amplifiers; and a latch selectably coupleable to at least one of said plurality of series connected differential amplifiers.

12. A method of offset calibrating a differential amplifier having first and second input nodes, a programmable source connected to said differential amplifier via an amplifier connection node, different from the first and second input nodes, and first and second autozero switches connected to said respective first and second input nodes and selectably jointly connected to ground, said method comprising:

closing first and second autozero switches connected to respective ones of the first and second input nodes of the differential amplifiers, to connect each of said first and second input nodes to ground;

measuring an output voltage from said selected differential amplifier; and calibrating the programmable source to provide an electric adjustment for setting the output voltage from said differential amplifier to substantially zero.

13. A method of calibrating a multistage comparator having a plurality of series connected amplifiers each having a programmable source that may be calibrated, and each amplifier having an amplifier input and an amplifier output, and each amplifier having an input autozero switch, each programmable source being connected to a respective amplifier via a connection that is different from the amplifier input and the amplifier output, said method comprising:

grounding the input autozero switch of a selected one of the amplifiers of a multistage comparator;

determining the output voltage of the selected amplifier; and calibrating the programmable source corresponding to the selected amplifier for adjusting the output voltage for said selected amplifier to substantially zero.

14. A method of calibrating a multistage comparator including a plurality of amplifiers each having an amplifier input and an amplifier output, an input autozero switch connected to each of said amplifier input node and each amplifier having first and second programmable sources selectable connected to the corresponding amplifier via a connection that is different from the amplifier input and amplifier output, said method comprising:

closing the input autozero switch of a selected one of the amplifiers of a multistage comparator;

determining the output voltage of the selected amplifier;

calibrating the first programmable source corresponding to the selected amplifier to adjust the output voltage for said selected amplifier to substantially zero;

opening the input autozero switch of the selected amplifier; and calibrating the second programmable source corresponding to the selected amplifier to adjust the output voltage for said selected amplifier stage to substantially zero under charge injection conditions.

15. A method of calibrating a multistage comparator having first and second amplifier stages, said first and second amplifier stages each having a stage input and a stage output with the first amplifier stage connected at the stage output of the second amplifier stage, each of said first and second amplifier stages having a programmable current source, which may be calibrated, connected to the respective amplifier stage via a connection different from the stage input and stage output, and each of the first and second amplifier stages producing an output voltage offset, said method comprising:

calibrating the current source of said first amplifier state to eliminate a voltage offset from said first amplifier; and calibrating the current source of said second amplifier state to eliminate a voltage offset from said second amplifier.

* * * * *